(12) United States Patent
Liu et al.

(10) Patent No.: US 11,688,746 B2
(45) Date of Patent: Jun. 27, 2023

(54) METHOD FOR PREPARING ARRAY SUBSTRATE, DISPLAY PANEL AND EVAPORATION APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Shujie Liu, Beijing (CN); Zhiyong Xue, Beijing (CN); Hailong Li, Beijing (CN); Lingling Ma, Beijing (CN); Hongyu Mi, Beijing (CN); Liangliang Liu, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/953,986

(22) Filed: Sep. 27, 2022

(65) Prior Publication Data

US 2023/0019100 A1 Jan. 19, 2023

Related U.S. Application Data

(62) Division of application No. 16/754,775, filed on Apr. 9, 2020, now Pat. No. 11,495,625.

(30) Foreign Application Priority Data

Dec. 4, 2018 (CN) .......................... 201811476207.0

(51) Int. Cl.
*H01L 27/12* (2006.01)
*C23C 14/04* (2006.01)
(Continued)

(52) U.S. Cl.
CPC ........ *H01L 27/1262* (2013.01); *C23C 14/042* (2013.01); *C23C 14/12* (2013.01); *C23C 14/24* (2013.01); *H01L 27/1288* (2013.01)

(58) Field of Classification Search
CPC ....... C23C 14/042; C23C 14/04; C23C 14/24; H01L 51/0011
See application file for complete search history.

(56) References Cited

U.S. PATENT DOCUMENTS 11,018,327 B2 * 5/2021 Wang .................... C23C 14/042
11,056,677 B2 * 7/2021 Zhang ................... C23C 14/042
(Continued)

FOREIGN PATENT DOCUMENTS

CN 101641765 A 2/2010
CN 201516958 U 6/2010
(Continued)

*Primary Examiner* — Jaehwan Oh
(74) *Attorney, Agent, or Firm* — The Webb Law Firm

(57) ABSTRACT

A method for preparing an array substrate, a display panel and an evaporation apparatus are disclosed. A method comprises: fixing a base substrate to an evaporation stage; attaching at least one shielding sheet to the base substrate to cover at least a preset area of the base substrate; arranging and aligning an open mask in association with the base substrate, wherein the open mask has at least one opening for vapor deposition, and the at least one shielding sheet is positioned corresponding to the at least one opening and each has an area that is less than an area of a corresponding opening to shield a portion of the corresponding opening, and wherein the portion of the corresponding opening is separate from a boundary of the corresponding opening; and evaporating to form an evaporation material layer on the base substrate, to which the shielding sheet is attached.

8 Claims, 3 Drawing Sheets

(51) Int. Cl.
*C23C 14/12* (2006.01)
*C23C 14/24* (2006.01)

(56) References Cited

U.S. PATENT DOCUMENTS

| | | | |
|---|---|---|---|
| 2008/0230372 | A1 | 9/2008 | Cousins et al. |
| 2019/0237710 | A1* | 8/2019 | Zhang .................. C23C 14/042 |
| 2020/0270740 | A1 | 8/2020 | Ji et al. |
| 2021/0305542 | A1* | 9/2021 | Kim ..................... H10K 71/166 |
| 2021/0336147 | A1* | 10/2021 | Ye ....................... H10K 71/164 |

FOREIGN PATENT DOCUMENTS

| | | | | |
|---|---|---|---|---|
| CN | 202671644 | U | 1/2013 | |
| CN | 106676468 | A | 5/2017 | |
| CN | 206804264 | A | 12/2017 | |
| CN | 108198958 | A * | 6/2018 | ........... C23C 14/042 |
| CN | 108198958 | A | 6/2018 | |
| CN | 108277473 | A | 7/2018 | |
| CN | 108666420 | A | 10/2018 | |
| CN | 108866476 | A | 11/2018 | |
| CN | 109306448 | A | 2/2019 | |
| CN | 109468593 | A | 3/2019 | |
| CN | 110112321 | A | 8/2019 | |
| JP | 2004202457 | A | 7/2004 | |
| WO | 2018176848 | A1 | 10/2018 | |

* cited by examiner

METHOD FOR PREPARING ARRAY SUBSTRATE, DISPLAY PANEL AND EVAPORATION APPARATUS

CROSS-REFERENCE TO RELATED APPLICATIONS

This application is a divisional of U.S. patent application Ser. No. 16/754,775, filed on Sep. 16, 2019, which is a United States national phase of International Application No. PCT/CN2019/105975, filed on Sep. 16, 2019, and claims a priority of Chinese patent application No. 201811476207.0, filed on Dec. 4, 2018, the disclosures of which are incorporated herein by reference in their entirety.

TECHNICAL FIELD

The present disclosure relates to the field of display technology, and in particular, to a method for preparing an array substrate, a display panel, and an evaporation apparatus.

TECHNICAL BACKGROUND

With the development of display screens, currently display screens will also be used in the field of watches and clocks. For example, in some products, a hole is opened in the middle of the panel for locating mechanical pointers of a watch. However, for conventional evaporation and packaging techniques, the organic material evaporated on the substrate glass of the panel and the frit glue (or, glass glue) used for the package have poor adhesion or even cannot be bonded, thus the substrate glass and the cover glass cannot be bonded together by the frit glue after being cured, resulting in that there could be a problem of package leakage at the position of the opening in the middle.

SUMMARY

According to an aspect of the present disclosure, there is provided a method for preparing an array substrate, comprising: fixing a base substrate to an evaporation stage; attaching a shielding sheet to the base substrate to cover at least a preset area of the base substrate; arranging and aligning an open mask in association with the base substrate; and evaporating to form a evaporation material layer on the base substrate, to which the shielding sheet is attached, with the open mask.

In some embodiments, the preset area is used to form a through hole therein, and an area of the shielding sheet is greater than an area of the through hole.

In some embodiments, attaching the shielding sheet to the base substrate comprises: placing the shielding sheet in a fixed position on a carrier; aligning the carrier with the base substrate so that the shielding sheet is aligned with the corresponding preset area; attaching the shielding sheet to the preset area; and separating the shielding sheet from the carrier.

In some embodiments, the carrier has a recess corresponding to the preset area of the base substrate; and placing the shielding sheet in a fixed position on the carrier comprises: placing the shielding sheet in the recess of the carrier.

In some embodiments, the evaporation stage is provided with an electromagnet, a material of the shielding sheet is a magnetic material, and a material of the carrier is a non-magnetic high molecular polymer; wherein fixing the shielding sheet to the preset through-hole area comprises: activating the electromagnet to attract the shielding sheet to the preset through-hole area of the base substrate.

In some embodiments, aligning the open mask with the base substrate comprises: the aligning is performed using a first alignment mark provided on the open mask and a third alignment mark on the base substrate.

In some embodiments, aligning the carrier with the base substrate comprises: the aligning is performed using a second alignment mark provided on the carrier and the third alignment mark on the base substrate.

In some embodiments, the manufacturing method further comprises: after the evaporating, removing the shielding sheet and the evaporation material layer on the shielding sheet.

According to another aspect of the present disclosure, there is provided a display panel comprising an array substrate and an opposite substrate disposed opposite to the array substrate, wherein the array substrate is prepared by the manufacturing method according to any one of the claims, and the display panel has a through hole penetrating through the array substrate and the opposite substrate, and the through hole penetrates the array substrate in the preset area.

According to a further aspect of the present disclosure, there is provided an evaporation apparatus comprising: an evaporation stage for carrying a substrate; and a mask assembly for evaporation, the mask assembly comprising: an open mask having at least one opening for evaporation; at least one shielding sheet corresponding to the at least one opening and each having an area less than an area of a corresponding opening.

In some embodiments, the mask assembly further comprises: a carrier for carrying the at least one shielding sheet, the at least one shielding sheet being disposed in a corresponding recess on the carrier.

In some embodiments, the evaporation apparatus further comprises an electromagnet, wherein a material of the at least one shielding sheet is a magnetic material.

In some embodiments, a material of the at least one shielding sheet is a stainless steel material.

In some embodiments, the open mask has a first align mark, the carrier has a second align mark, and the substrate has a third align mark, and wherein the open mask, the carrier, and the substrate are aligned with the first align mark, the second align mark, and the third align mark.

In some embodiments, the evaporation apparatus further comprises a source for supplying an evaporation material to the substrate.

In some embodiments, each of the at least one shielding sheet is configured so that its projection on the substrate covers a corresponding through hole to be formed in the substrate.

DETAILED DESCRIPTION OF ILLUSTRATIVE EMBODIMENTS

The technical solutions of the embodiments of the present disclosure will be clearly and fully described below with reference to the drawings which illustrate the embodiments of the present disclosure. Obviously, the described embodiments are only a part of the embodiments of the present disclosure, not for enumerating all of the embodiments. All other embodiments obtained by a person having ordinary skills in the art based on the embodiments of the present disclosure without creative efforts are intended to be embraced within the spirit and scope of the present disclosure.

According to some embodiments of the present disclosure, methods for manufacturing an array substrate (and a display panel including the array substrate) are provided. A method may comprise: fixing a base substrate to an evaporation stage; attaching a shielding sheet to the base substrate to cover at least a preset area of the base substrate; arranging and aligning an open mask in association with the base substrate; and evaporating to form a evaporation material layer on the base substrate, to which the shielding sheet is attached, with the open mask.

Figure 1:
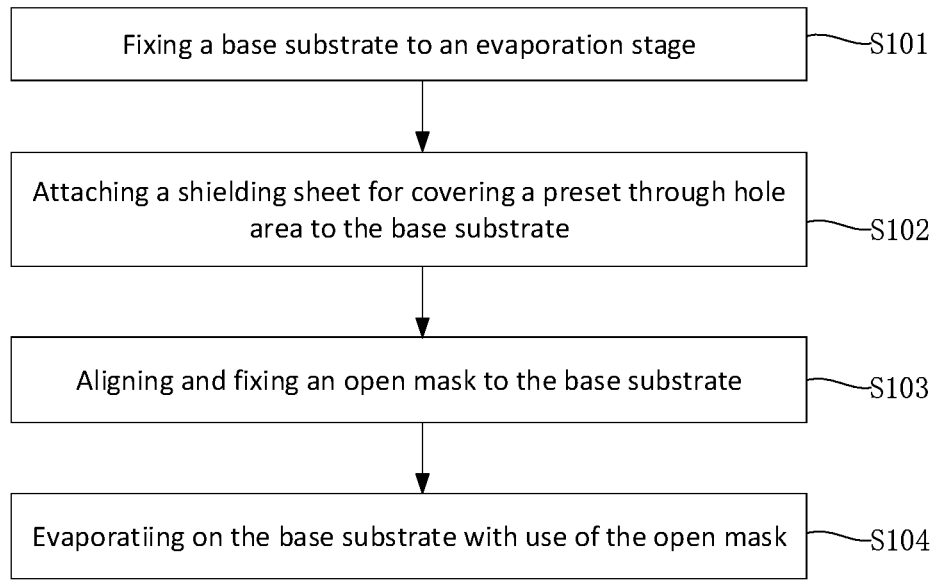
FIG. 1 is a schematic flowchart of a manufacturing method according to an embodiment of the present disclosure.

Referring to FIG. 1, a method for preparing an array substrate (and thus a display panel including the array substrate) according to some embodiments of the present disclosure may comprise the following steps:

Step S101, fixing a base substrate to an evaporation stage;

Step S102, attaching a shielding sheet for covering a preset area to the base substrate;

Step S103: aligning and fixing an open mask to the base substrate;

Step S104, performing evaporation on the base substrate to which the shielding sheet is attached with use of the open mask.

In this way, an array substrate or a display panel including the array substrate can be prepared.

In some embodiments, the thus prepared display panel may include the array substrate prepared as above and an opposite substrate disposed opposite to the array substrate. The prepared array substrate and the opposing substrate have a through hole penetrating through them. That is, the display panel may have a through hole penetrating the array substrate and the opposite substrate. The through hole may be formed in a preset area. Therefore, in the following, the preset area may also be referred to as a preset through-hole area.

According to some embodiments of the present disclosure, the above-mentioned array substrate or display panel may be applied in a wearable device. For example, when the above-mentioned array substrate or display panel is applied to a timepiece, the display panel can be used as a dial of the timepiece, and the through hole in the display panel can be used for positioning hands of watch. The array substrate may include the base substrate.

In some implementations, according to step S101, a base substrate is fixed onto the evaporation stage. After that, according to step S102, a shielding sheet 1 (see FIG. 3) is attached to a preset through-hole area of the base substrate to cover the preset through-hole area of the base substrate. Then, according to step S103, an open mask 3 (see FIG. 2) is aligned with the base substrate and fixed. The opening 31 (see FIG. 2) of the open mask 3 may correspond to a reserved through-hole area of the base substrate. The area of the opening 31 of the open mask 3 for evaporation is greater than the area of the shielding sheet 1. Then, according to step S104, the base substrate to which the shielding sheet is attached is evaporated by using the open mask.

During the evaporation, since the shielding sheet 1 covers the preset through-hole area of the base substrate, it is possible to effectively prevent the evaporation material from adhering to the preset through-hole area of the base substrate. When the evaporation material is an organic material, the organic material can be effectively prevented from adhering to the preset through-hole area of the base substrate, so that the position of the preset through-hole of the base substrate can be free of organic material. There is no particular limitation on the specific size of the shielding sheet 1 in this embodiment, and the shape and diameter size of the shielding sheet can be set according to the shape and diameter size of the through hole that needs to be opened. In some implementations, a through-hole having an area less than the shielding sheet 1 may be punched at the preset through-hole position on the base substrate. That is, the diameter size of the through hole can be made less than the diameter size of the coverage area of the shielding sheet 1 on the base substrate. In this way, there can be a ring-shaped reserved area without organic material around the through hole. During a subsequent frit glue encapsulation of the array substrate and the opposite substrate, the frit glue located in the ring-shaped reserved area can be prevented from being affected by the organic materials and has good adhesion, so that the array substrate and the opposite substrate have better adhesion. Thus, the problem of package leakage at the through hole of the display panel can be effectively alleviated.

In some embodiments, the aforementioned manufacturing method may be used to prepare a ring-shaped display panel in which the substrate has a through hole.

According to the embodiments of the present disclosure, the preset through-hole position of the base substrate can be shielded by the shielding sheet 1, so as to avoid evaporation of organic materials to the preset through-hole position, thereby effectively alleviating or solving the problem of package air leakage of the through-hole position of the display panel.

In some embodiments, during the evaporation process of the base substrate, in order to facilitate the fixing of the shielding sheet 1 to the reserved through-hole area of the base substrate, attaching the shielding sheet 1 for covering the preset through-hole area to the base substrate may specifically include the following steps.

The shielding sheet 1 is placed in a fixed position of a carrier (for example, a tray) 2.

The tray 2 is aligned with the base substrate, so that the shielding sheet 1 is aligned with the corresponding preset through-hole area. For example, the tray 2 may be aligned with and attached to the base substrate.

The shielding sheet 1 is attached (e.g., fixed) to the preset through-hole area. In some implementations, the shielding sheet 1 may be separated from the tray 2 at this time or later.

After that, the tray 2 is removed. The tray 2 can be moved away from the evaporation area. In this way, the tray 2 can be used to fix the shielding sheet 1 to the preset through-hole area of the base substrate; and the present disclosure is not limited thereto.

The base substrate may have a plurality of evaporation areas. Correspondingly, the open mask 3 for evaporation may have a plurality of openings 31 for evaporation. Each of the evaporation areas of the base substrate to be evaporated may have at least one preset through-hole area. The plurality of shielding sheets 1 may be disposed at positions on the tray 2 corresponding to the preset through-hole areas of the base substrate in one-to-one manner. The plurality of shielding sheets 1 may be respectively fixed at preset positions of the tray 2. The positions of the tray 2 where the shielding sheets are to be set face the base substrate to be evaporated (or, in other words, the surface of the base substrate to be evaporated). After the tray 2 is aligned with the base substrate to be evaporated, the shielding sheet 1s are also aligned with the preset through-hole areas in one-to-one manner. Then, the shielding sheets 1 are attached to the preset through-hole areas; at this time or after, the shielding sheets 1 are separated from the tray 2. Then the tray 2 is removed away from the evaporation area. Next, a subsequent evaporation operation is performed on the base substrate to be evaporated using the open mask 3. According to the embodiment of the present disclosure, the tray 2 can be used to fix the shielding sheet 1 to the reserved through-hole area of the base substrate to be evaporated, with high accuracy and simple and convenient operation.

In a specific embodiment, the tray 2 may have a recess (for example, concave portion, groove, or the like) corresponding to the preset through-hole region of the base substrate. The method for placing the shielding sheet 1 on a fixed position of the tray 2 may specifically include: placing the shielding sheet 1 in the recess of the tray 2. By providing a recess on the tray 2 to contain and fix the shielding sheet 1, the structure is simple and the operation is convenient.

In a specific embodiment, the evaporation stage may be provided with an electromagnet, the material of the shielding sheet 1 may be a magnetic material, and the material of the tray 2 may be a non-magnetic polymer. In this example, the shielding sheet 1 can be fixed to the preset through-hole area by activating the electromagnet to attract the shielding sheet 1 to the preset through-hole area of the substrate.

In an embodiment, the shielding sheet 1 is a shielding sheet 1 of magnetic material, the evaporation stage for evaporation is provided with an electromagnet, and the material of the open mask 3 for subsequent evaporation is a magnetic material. The magnetic material comprises, but is not limited to, stainless steel. The open mask 3 is fixed to the evaporation stage by a magnetic force with the electromagnet, so that the substrate on the evaporation stage is evaporated by using the mask 3. The shielding sheet 1 is configured to include a magnetic material, so that it can also be attached to a preset through-hole region of the base substrate by virtue of a magnetic force with the electromagnet.

In a specific example, the shielding sheet 1 can be attached to a base substrate as follows. After placing the shielding sheet 1 onto the tray 2, the tray 2 is aligned with the base substrate; after that, the electromagnet on the evaporation stage is activated, and the shielding sheet 1 is attached and fixed to the preset through-hole area of the substrate by the magnetic force between the shielding sheet 1 and the electromagnet. Since the tray 2 is of a non-magnetic material (for example, a high-molecular polymer material), it is non-magnetic and will not be affected by the electromagnet. After the shielding sheet 1 is attached to the base substrate, the tray 2 is moved, that is, the tray 2 can be separated from the shielding sheet 1. The shielding sheet 1 made of a magnetic material is fixed to the preset through-hole area on the base substrate by a magnetic force with the electromagnet. The method is simple, reliable, and easy to operate.

In a specific embodiment, the material of the shielding sheet 1 may be set to be the same as that of the open mask 3. For example, the shielding sheet 1 may be provided as a shielding sheet 1 made of stainless steel. It should be noted that the shielding sheet 1 may also be provided with another magnetic material; the present disclosure is not limited to the embodiments shown here.

Figure 2:
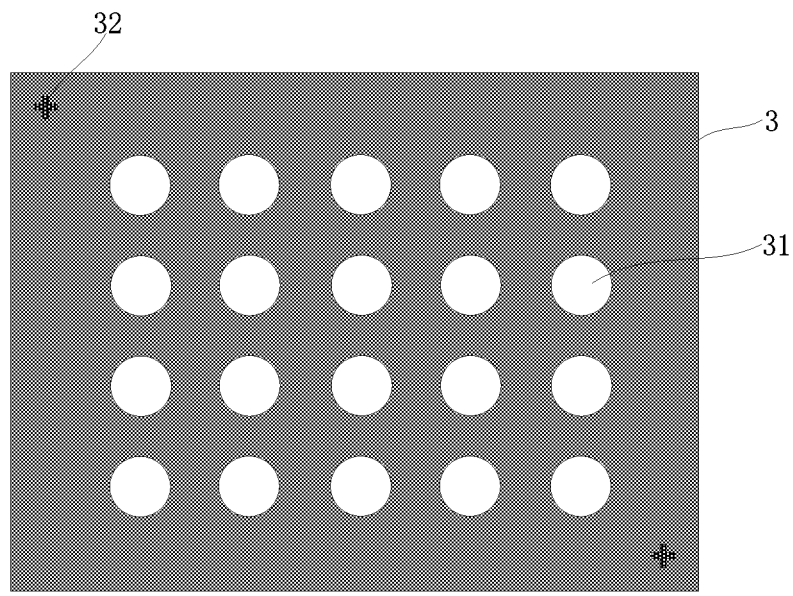
FIG. 2 is a schematic structural diagram of an open mask according to an embodiment of the present disclosure.
Figure 3:
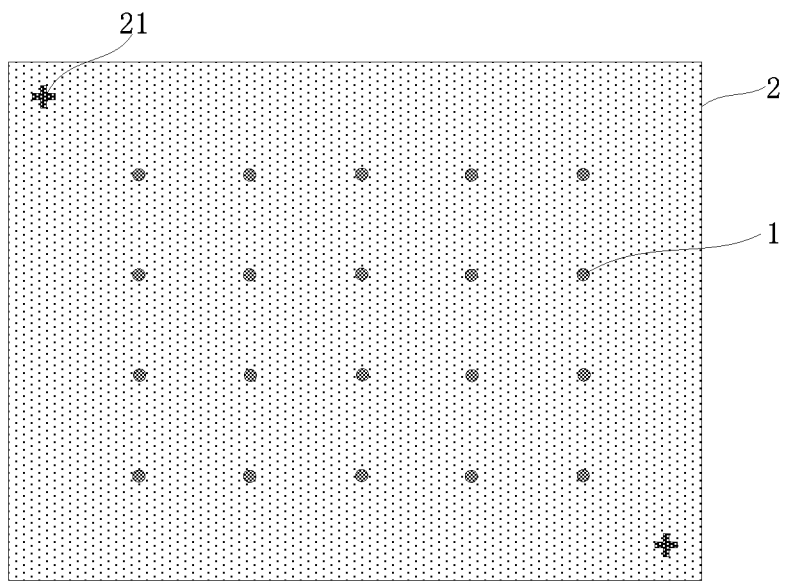
FIG. 3 is a schematic structural diagram of a tray according to an embodiment of the present disclosure.
Figure 4:
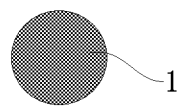
FIG. 4 is a schematic structural diagram of a shielding sheet according to an embodiment of the present disclosure.

In some embodiments, an alignment mark (first alignment mark) 32 may be provided on the open mask 3, and an alignment mark (second alignment mark) 21 may be provided on the tray 2 as shown in FIG. 2 and FIG. 3 shown. The base substrate may be provided with an alignment mark (a third alignment mark, which is not shown in the figure). Referring to FIG. 3, the method for aligning the tray 2 with the base substrate may specifically include: using the alignment mark (second alignment mark) 21 provided on the tray 2 and the alignment mark (third align mark) on the substrate to perform the aligning. The base substrate is provided with the third alignment mark for film/layer preparation. When the tray 2 is aligned with the base substrate, the aligning can be performed with the second align mark 21 on the tray 2 and the third align mark on the base substrate so that the shielding sheet 1 placed on the tray 2 is in alignment with the preset through-hole area on the base substrate; thus, the alignment efficiency and alignment accuracy of the tray 2 and the base substrate can be effectively improved.

In some embodiments, referring to FIG. 2, aligning the open mask 3 with the base substrate may specifically include: performing the alignment with use of the first alignment mark 32 provided on the open mask 3 and the third alignment mark on the base substrate. By using the first alignment mark 32 on the open mask 3 and the third alignment mark on the base substrate to align, the alignment of the open mask 3 and the base substrate can be completed quickly, and the alignment accuracy between the open mask 3 and the base substrate it can be effectively improved.

After the evaporation is performed, the shielding sheet and the evaporation material layer on the shielding sheet may be removed.

According to an embodiment of the present disclosure, there is further provided a display panel which may include an array substrate and an opposite substrate disposed opposite to the array substrate. The array substrate includes a base substrate and an evaporation material layer on the base substrate. The array substrate may be an array substrate according to any embodiment of the present disclosure or an array substrate prepared according to any method embodiment of the present disclosure. The evaporation material layer is prepared by using any one of the preparation methods described in the above technical solutions. In some implementations, the array substrate and the opposing substrate have a through hole that passes through both. The through hole may penetrate the array substrate in the preset area.

Figure 5:
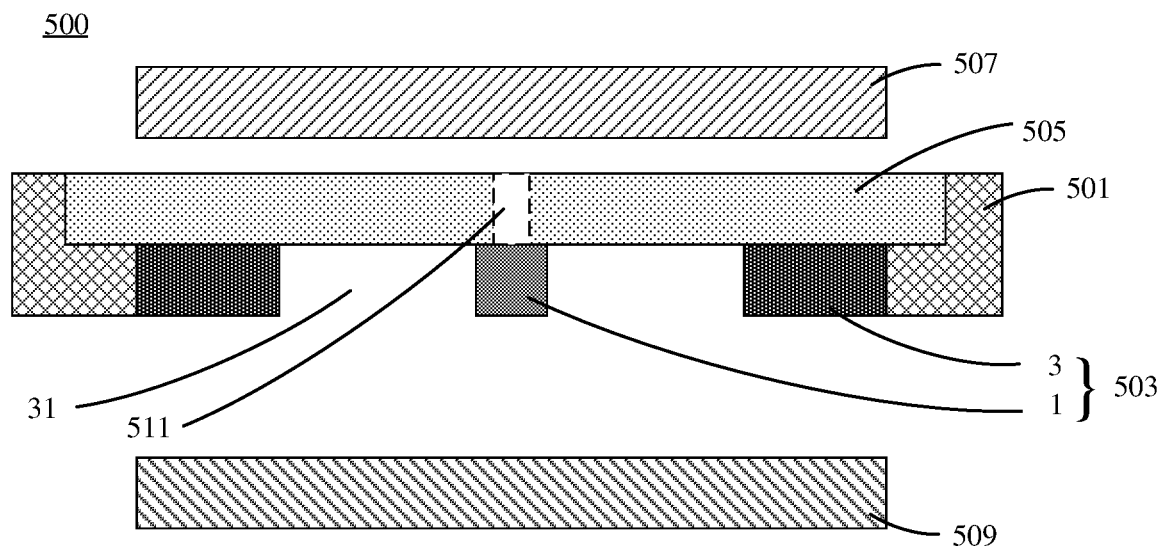
FIG. 5 illustrates a schematic view of an evaporation apparatus according to an embodiment of the present disclosure.

FIG. 5 schematically illustrates an evaporation apparatus according to an embodiment of the present disclosure. As shown in FIG. 5, the evaporation apparatus 500 may include a carrier stage 501 and a mask assembly 503 for evaporation. The carrier stage 501 is used to carry the base substrate 505 for evaporation on the substrate 505. The mask assembly 503 may include: an open mask 3 having at least one opening 31 for evaporation; and at least one shielding sheet 1 corresponding to the opening 31. The area of the shielding sheet 1 is configured to be less than the area of the corresponding opening 31.

In some embodiments, the mask assembly may further include a carrier (for example, a tray) 2 (see FIG. 3) for carrying the shielding sheet 1. The carrier 2 may be provided with a recess for holding the shielding sheet 1. In FIG. 5, the shielding sheet 1 is shown as being attached to the substrate.

In some embodiments, the evaporation apparatus 500 further includes an electromagnet 507 to provide magnetic force. In a specific example, the electromagnet may be loaded to the evaporation stage. The material of the shielding sheet 1 may be a magnetic material. The shielding sheet 1 is fixed to the evaporation stage by the magnetic force between the shielding sheet and the electromagnet, which is simple and reliable, and convenient to operate. The material of the open mask 3 may be the same as that of the shielding sheet 1. In this way, both the open mask 3 and the shielding sheet 1 can be fixed to the evaporation stage by the magnetic force with the electromagnet, which is simple and reliable and the operation thereof is convenient. In addition, the open mask and the shielding sheet are fixed to the evaporation stage in the same manner to cooperate with the evaporation operation, which is helpful to simplify the overall apparatus and facilitate the operation. Specifically, the material of the shielding sheet 1 and the open mask 3 may be, for example, a stainless steel material.

In some embodiments, the evaporation apparatus further includes a source 509 for providing evaporation material to the substrate. As will be understood by those skilled in the art, the source 509 may be used to contain a material to be evaporated, such as an organic material. In an embodiment, the source 509 further has a heating means for evaporating the material to be evaporated and/or means for discharging or directing a gas flow.

In some embodiments, each of the at least one shielding sheet is configured such that its projection on the substrate covers a corresponding through hole 511 (shown by a dashed box in FIG. 5) to be formed in the substrate.

It should be understood that the schematic diagram shown in FIG. 5 is merely exemplary, and the present disclosure is not limited to the embodiment shown in FIG. 5. For example, in other embodiments, the orientation of the evaporation apparatus shown in FIG. 5 may be changed or reversed.

According to the embodiments of the present disclosure, it is possible to effectively prevent the evaporation material from adhering to the preset through-hole area of the base substrate. Especially when the evaporation material is an organic material, the organic material can be effectively prevented from adhering to the preset through-hole area of the base substrate, thereby preventing the adhesive used for bonding or sealing in the subsequent process from being affected by the organic material. In this way, bonding performance and sealing performance can be enhanced. According to the embodiments of the present disclosure, it is possible to make the array substrate and the opposite substrate have better adhesion, and effectively alleviate the problem of package leakage at the through hole of the display panel.

Obviously, various modifications and variations to the embodiments of the present disclosure can be made by those skilled in the art without departing from the spirit and scope of the present disclosure. Thus, those modifications and variations of the present disclosure which fall within the scope of the claims of the present disclosure and their equivalents are intended to be embraced by the present disclosure.

What is claimed is:

1. A method for preparing an array substrate, comprising:
   fixing a base substrate to an evaporation stage;
   attaching at least one shielding sheet to the base substrate to cover at least a preset area of the base substrate;
   arranging and aligning an open mask in association with the base substrate,
   wherein the open mask has at least one opening for vapor deposition, and the at least one shielding sheet is positioned corresponding to the at least one opening and each has an area that is less than an area of a corresponding opening to shield a portion of the corresponding opening, and
   wherein the portion of the corresponding opening is separate from a boundary of the corresponding opening; and
   evaporating to form an evaporation material layer on the base substrate, to which the shielding sheet is attached, with the open mask.

2. The method according to claim 1, wherein the preset area is used to form a through hole therein, and an area of the shielding sheet is greater than an area of the through hole.

3. The method according to claim 1, wherein attaching the shielding sheet to the base substrate comprises:
   placing the shielding sheet in a fixed position on a carrier;
   aligning the carrier with the base substrate so that the shielding sheet is aligned with the corresponding preset area;
   attaching the shielding sheet to the preset area; and
   separating the shielding sheet from the carrier.

4. The method according to claim 3, wherein the carrier has a recess corresponding to the preset area of the base substrate;
   wherein placing the shielding sheet in a fixed position on the carrier comprises:
   placing the shielding sheet in the recess of the carrier.

5. The method according to claim 3, wherein the evaporation stage is provided with an electromagnet, the shielding sheet comprises a magnetic material, and the carrier comprises a non-magnetic high molecular polymer;
   wherein attaching the shielding sheet to the base substrate comprises:
   activating the electromagnet to attract the shielding sheet to the base substrate.

6. The method according to claim 1, wherein aligning the open mask with the base substrate comprises:
   aligning the open mask with the base substrate with use of a first alignment mark provided on the open mask plate and a third alignment mark on the base substrate.

7. The method according to claim 3, wherein aligning the carrier with the base substrate comprises:
   aligning the carrier with the base substrate with use of a second alignment mark provided on the carrier and the third alignment mark on the base substrate.

8. The method according to claim 3, further comprising:
   after the evaporating, removing the shielding sheet and the evaporation material layer on the shielding sheet.

* * * * *